(12) United States Patent
Garreau et al.

(10) Patent No.: US 9,267,967 B2
(45) Date of Patent: Feb. 23, 2016

(54) DEVICE FOR THE ELECTROMAGNETIC TESTING OF AN OBJECT

(75) Inventors: Philippe Garreau, Paris (FR); Luc Duchesne, Angervilliers (FR); Raphaël Laporte, Bois Colombes (FR); Ludovic Durand, Marcoussis (FR)

(73) Assignee: Satimo Industries (FR)

( * ) Notice: Subject to any disclaimer, the term of this patent is extended or adjusted under 35 U.S.C. 154(b) by 163 days.

(21) Appl. No.: 13/878,311

(22) PCT Filed: Oct. 7, 2011

(86) PCT No.: PCT/EP2011/067590
§ 371 (c)(1),
(2), (4) Date: Apr. 8, 2013

(87) PCT Pub. No.: WO2012/045877
PCT Pub. Date: Apr. 12, 2012

(65) Prior Publication Data
US 2013/0207680 A1    Aug. 15, 2013

(30) Foreign Application Priority Data
Oct. 8, 2010   (FR) ...................................... 10 58192

(51) Int. Cl.
   *G01R 1/073*   (2006.01)
   *G01R 1/04*    (2006.01)
   *G01R 29/08*   (2006.01)

(52) U.S. Cl.
   CPC .............. *G01R 1/073* (2013.01); *G01R 1/0408* (2013.01); *G01R 29/0821* (2013.01)

(58) Field of Classification Search
USPC ........................................................ 343/703
See application file for complete search history.

(56) References Cited

U.S. PATENT DOCUMENTS

| 3,273,150 | A | * | 9/1966 | Emerson ........................... 342/4 |
| 3,332,019 | A | * | 7/1967 | Joseph et al. .................. 343/703 |
| 4,800,387 | A | * | 1/1989 | Joy ................................. 342/165 |
| 4,968,983 | A | * | 11/1990 | Maeda ........................... 343/703 |
| 5,006,788 | A | * | 4/1991 | Goulette et al. ................. 324/95 |
| 5,045,636 | A | * | 9/1991 | Johnasen et al. .............. 174/375 |

(Continued)

FOREIGN PATENT DOCUMENTS

| EP | 565464 A1 * | 10/1993 | ............. G01R 29/10 |
| EP | 0629865 A1 | 12/1994 | |

(Continued)

OTHER PUBLICATIONS

Hasumi Ryoichi et al JP 2006234602 A, machine translation.*

(Continued)

*Primary Examiner* — Jermele M Hollington
*Assistant Examiner* — Suresh K Rajaputra
(74) *Attorney, Agent, or Firm* — Lerner, David, Littenberg, Krumholz & Mentlik, LLP

(57) ABSTRACT

The invention relates to a device for the electromagnetic testing of an object, comprising a network of electromagnetic probes, a structure for supporting the network of probes and a support for supporting the object being tested. According to the invention, the structure is closed in the three dimensions of space all around the support for the object being tested by at least one conductive wall forming a Faraday cage which is fitted on its inner side by anechoic electromagnetic absorbers located in the intervals between the probes.

16 Claims, 10 Drawing Sheets

(56) References Cited

U.S. PATENT DOCUMENTS

Figure 1:
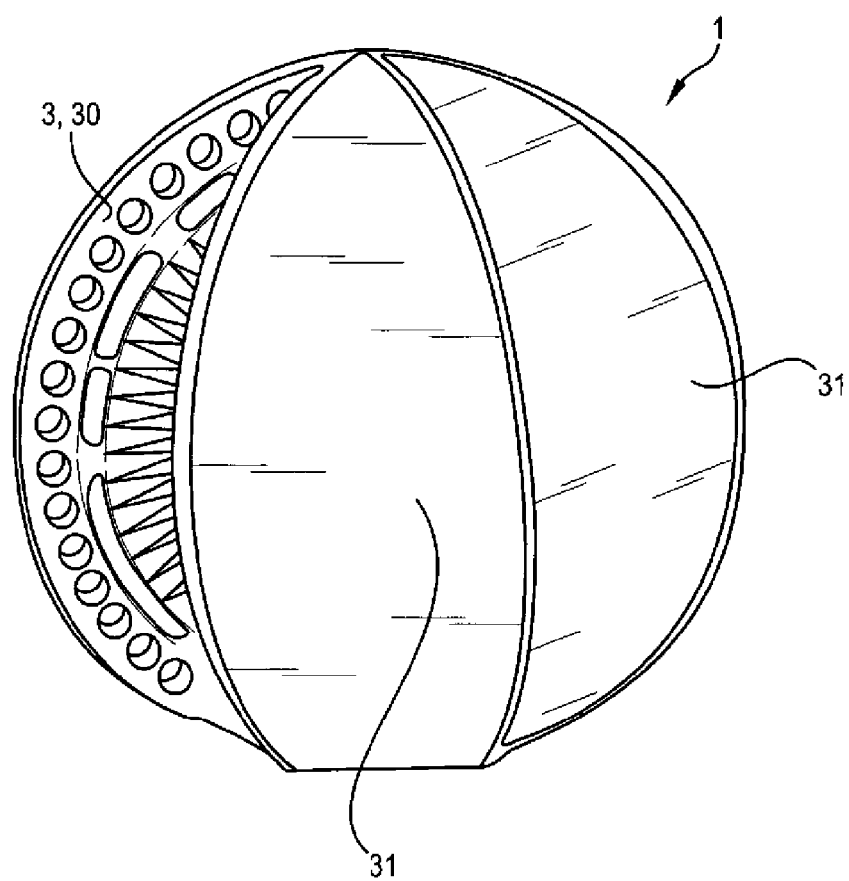

| | | | | |
|---|---|---|---|---|
| 5,302,960 A * | 4/1994 | Boers | ............................ | 342/372 |
| 5,532,704 A * | 7/1996 | Ruelle | ............................ | 343/703 |
| 6,104,291 A * | 8/2000 | Beauvillier et al. | ......... | 340/572.1 |
| 6,255,830 B1 * | 7/2001 | Rollin et al. | ..................... | 324/627 |
| 7,280,077 B2 * | 10/2007 | Woo et al. | ...................... | 343/703 |
| 7,642,973 B2 * | 1/2010 | Maekawa et al. | .............. | 343/703 |
| 8,436,777 B2 * | 5/2013 | Ito et al. | ........................ | 343/703 |
| 8,482,294 B2 * | 7/2013 | Garreau et al. | ................ | 324/629 |
| 2004/0075443 A1 * | 4/2004 | Hemming et al. | ............. | 324/637 |
| 2005/0128150 A1 * | 6/2005 | Chen | ............................ | 343/702 |
| 2007/0018654 A1 * | 1/2007 | Garreau et al. | ................ | 324/501 |
| 2009/0167321 A1 * | 7/2009 | Krueger et al. | ................ | 324/612 |
| 2010/0109957 A1 * | 5/2010 | Moon et al. | .................... | 343/703 |
| 2010/0128124 A1 * | 5/2010 | Cho et al. | ...................... | 348/143 |
| 2010/0134364 A1 * | 6/2010 | Okazaki | ......................... | 343/703 |
| 2010/0171669 A1 * | 7/2010 | Ito et al. | ........................ | 343/703 |
| 2012/0286122 A1 * | 11/2012 | Tankielun et al. | ........ | 248/346.06 |
| 2013/0207680 A1 * | 8/2013 | Garreau et al. | ........... | 324/750.23 |

FOREIGN PATENT DOCUMENTS

| | | | | |
|---|---|---|---|---|
| EP | 1724596 A1 | 11/2006 | | |
| EP | 1724596 B1 * | 2/2011 | ............. | G01R 29/08 |
| FR | 2611333 A1 * | 8/1988 | ............... | G02B 6/44 |
| JP | 59-119277 | 7/1984 | | |
| JP | 2005061949 | 3/2005 | | |
| JP | 2006-234602 A * | 9/2006 | ............. | G01R 29/08 |
| JP | 2006234602 A * | 9/2006 | ............. | G01R 29/08 |
| JP | 2007033254 A | 2/2007 | | |
| WO | 2010006891 A1 | 1/2010 | | |

OTHER PUBLICATIONS

FR 2611333 A1, Rouelle Philippe, Machine Translation, PDF attached.*

Hasumi Ryoichi et al JP 2006234602 A, Sep. 2006, machine translation.*

Benoit Fourestié et al., "Spherical Near Field 30 Facility for Characterizing Random Emissions", IEEE Transactions on Antennas and Propagation, vol. 53, No. 8, Aug. 2005.

French Search Report for Application No. FR1058192 dated Jun. 1, 2011.

International Search Report for Application No. PCT/EP2011/067590 dated Feb. 14, 2012.

* cited by examiner

DEVICE FOR THE ELECTROMAGNETIC TESTING OF AN OBJECT

CROSS REFERENCE TO RELATED APPLICATIONS

The present application is a national phase entry under 35 U.S.C. §371 of International Application No. PCT/EP2011/067590, filed on Oct. 7, 2011, which claims priority from French Patent Application No. 1058192, filed Oct. 8, 2010, the disclosures of which are incorporated by reference herein.

The invention relates to a device for the electromagnetic testing of at least one object, such as for example a radiating object.

Examples of such objects being tested which can be cited are one or more antennas fed by cables or else fitted directly by their sources or else their integrated receivers, and capable of operating in transmission and/or in reception.

The aim is for example to know the response from the antenna and from the integrated receiver of a portable phone to external electromagnetic radiations.

Or the aim is for example to know the response from a GPS antenna with its onboard receiver to external electromagnetic interferences.

Or the aim is for example to measure the diagram of radiation of a radar antenna in several directions of space.

Or the aim is for example to measure the sensitivity of a portable phone in several directions of space.

This type of device for the electromagnetic testing of at least one radiating object, comprising a network of electromagnetic probes for transmission and/or reception of electromagnetic radiations towards or from the object being tested, the device also comprising a support structure for supporting the network of probes and a support for the object being tested, is known.

For example, document WO 2010/006891 describes a network of electromagnetic probes distributed over a sphere, having as support for the object being tested a mast which extends from a positioning device to near the geometric centre of the sphere.

In the prior art there is also networks of probes in arches, rings or on one plane, such as for example according to the document "Spherical Near Field Facility for Characterizing Random Emissions", of Benoît Fourestié, Jean-Charles Bolomey, Thierry Sarrebourse, Zwi Altman, Joe Wiart in IEEE Transactions on Antennas and Propagation, Vol. 53, No. 8, August 2005.

These devices are arranged in an anechoic chamber to prevent parasite radiation reflections, and faradised to dispense with external electromagnetic perturbations.

One of the disadvantages of these known devices arranged in a faradised anechoic chamber is the often considerable size of the chambers which require the construction of large buildings and the use of large numbers of electromagnetic absorbers to cover the large internal surfaces, which creates substantial costs and production times.

Another disadvantage is that the faradised anechoic chamber is often installed by an entity different to that which installs the measuring system inside the chamber, which represents an additional risk for projects, both from the organisational and planning viewpoint and from the viewpoint of final responsibility of the measuring performance of the final means.

Another disadvantage is that the quality of electromagnetic measurements is directly attributable to the capacity of the faradised anechoic chamber in limiting internal echoes and the external perturbations requiring both high-quality electromagnetic absorbers and heavy electromagnetic shielding, which can be costly.

Another disadvantage is that the presence of equipment or mechanical support pieces reflecting or diffracting electromagnetic waves near the measuring probes can degrade measurement quality.

The aim of the invention is to obtain an electromagnetic test device which rectifies the disadvantages of the prior art.

For this purpose, the invention relates to a device for the electromagnetic testing of at least one object, the device comprising a network of electromagnetic probes for transmission and/or for reception of electromagnetic radiations towards or from the object being tested, the device also comprising a support structure for supporting the network of probes, comprising anechoic electromagnetic absorbers, and a support for supporting the object being tested, characterised in that the support structure for supporting the network of probes is closed in the three dimensions of space all around the support for the object being tested by at least one conductive wall forming a Faraday cage which is fitted on its inner side by anechoic electromagnetic absorbers located in the intervals between the probes.

The test device according to the invention has integrated-"faradisation", meaning that instead of having a faradised chamber which is disconnected from the measuring means formed by the probes, the invention proposes a faradised chamber forming an integral part of the measuring means, with all the advantages that comprises in terms of size reduction of the chamber, reduction in required civil engineering work, reduction in installation time, reduction in numbers of absorbers used, reduction in costs, and mobility.

In fact, the state of the art consists of placing the measuring means, such as for example the network of probes described in document WO 2010/006891, in an independent faradised and anechoic chamber.

Therefore, instead of having an anechoic chamber disconnected from the measuring means, the device according to the invention proposes an anechoic chamber forming part of the measuring means with electromagnetic absorbers between the probes and all the advantages that comprises in terms of reduction of volume of the chamber, reduction of the surface covered by the absorbers, reduction in costs, mobility. In particular, the test device according to the invention could be relocatable much more easily anywhere, including outside a conventional anechoic chamber.

In addition, the device according to the invention always offers the same electromagnetic environment controlled in advance around the object being tested, which guarantees constant quality of measurements.

In an embodiment of the invention, the conductive wall is curved. In another embodiment of the invention, the conductive wall can be facetted.

In an embodiment of the invention, the support structure has a general spherical shape.

In an embodiment of the invention, the support structure comprises at least one upright to which are fixed the probes and the at least one conductive wall, wherein anechoic electromagnetic absorbers are also provided on the inner side of the uprights in the intervals between the probes.

In an embodiment of the invention, the at least one conductive wall is fixed to the outer side of the at least one upright by means of at least one radiofrequency joint.

In an embodiment of the invention, the support structure delimits a closed volume containing the support for the object being tested.

In an embodiment of the invention, the closed volume delimited by the support structure also contains a relative displacement system for relative displacement of the support relative to the support structure according to at least one degree of liberty.

In an embodiment of the invention, the relative displacement system located inside the support structure is constituted by at least one first relative angular displacement system enabling at least one determined sliding angular displacement of the support structure relative to the support about a non-vertical geometric axis.

In an embodiment of the invention, the support structure (3) of the network of probes (2) comprises a first part (3001) for supporting a first group of probes (2), fixed on a lower base (3002), and a second part (3003) for supporting a second group of probes (2), movable on the lower base (3002) between one and the other of a first closed position against the first part (3001) to form the Faraday cage, and a second position removed relative to the first part (3001) to make a free passage space (3010) between the first part (3001) and the second part (3003).

In an embodiment of the invention, the second part (3003) is articulated about a vertical axis (3004) on the lower base (3002) for displacement in rotation about this vertical axis (3004) between one and the other of the first position and of the second position.

In an embodiment of the invention, the device comprises at least one motor (3019) to move the second part (3005) relative to the first part (3001) between one and the other of the first position and of the second position, and in the first position capable of keeping the second part (3003) closed against the first part (3001) to form the Faraday cage.

In an embodiment of the invention, the first part (3001) and the second part (3003) comprise respectively at least one first edge (3005) and at least one second edge (3006), which are turned towards each other in the first closed position, the first edge (3005) and/or the second edge (3006) comprising at least one radiofrequency elastic joint (3007) positioned to be compressed by the other of the first edge (3005) and/or second edge (3006) in the first closed position.

In another embodiment of the invention, the relative displacement system located inside the support structure allows at least one relative angular rotation displacement of the support structure relative to the support about a vertical geometric axis.

In an embodiment of the invention, the support structure rests on a lower base, and provided between the base and the support structure is a second other angular displacement system enabling to displace the support structure relative to the base by a second angle of the same absolute value and opposite the sliding angular displacement of the first relative angular displacement system of the support relative to the support structure so that the support for the object being tested retains a prescribed and substantially constant position relative to the vertical.

In an embodiment of the invention, the second other angular displacement system comprises a plurality of support rollers for supporting an outer curved surface of the wall of the support structure on the base and at least one drive motor for driving at least one of the rollers to make said outer curved surface of the wall of the support structure roll relative to the base by said second angle.

In an embodiment of the invention, the device also comprises:

a control element for controlling the sliding angular displacement of the first angular displacement system, at least one sensor for measuring a real angle of the support for the object being tested relative to the vertical, a feedback loop for controlling the drive motor as a function of the angle measured by the sensor, so that the angle measured by the sensor is equal to a constant value corresponding to said prescribed position of the support relative to the vertical.

In an embodiment of the invention, the probes are distributed equiangularly according to at least one spherical coordinate about a same target point of the probes. In another embodiment of the invention, the probes are distributed according to arbitrary angular positions by means of manual or motorised sliding means on the support structure of the probes about a same target point of the probes.

In an embodiment of the invention, an individual regulating system for regulating the mechanical alignment of the probe relative to a same target point is provided on at least one of the probes for all the probes, a target point where the object being tested must be centred on the support.

In an embodiment of the invention, the individual regulating system for regulating the mechanical alignment of the probe is associated to at least one optical detection camera positioned at the target point to measure the mechanical alignment of the probe.

In an embodiment of the invention, the individual regulating system for regulating the mechanical alignment of the probe comprises motorisation of said probe on the support structure to move the probe relative to the support structure according to at least one degree of liberty other than in an aiming direction of the probe towards the target point.

In an embodiment of the invention, an analysis module for analysing the image supplied by the camera is provided to detect in this image the trace of said probe and a feedback module for controlling the motorisation to align the detected trace of the probe on a setpoint trace corresponding to the alignment of the probe on the target point is provided.

Figure 2:
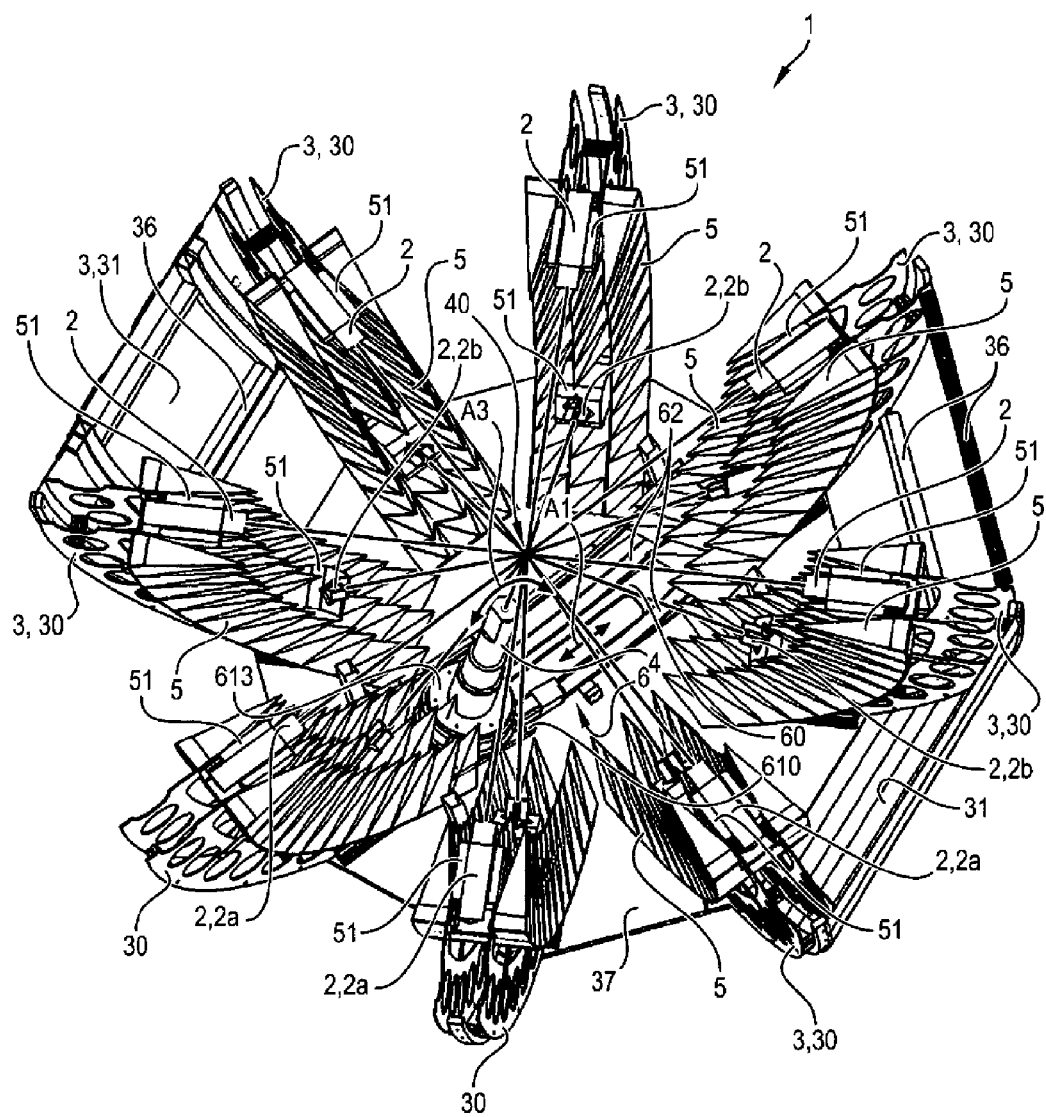
Figure 3:
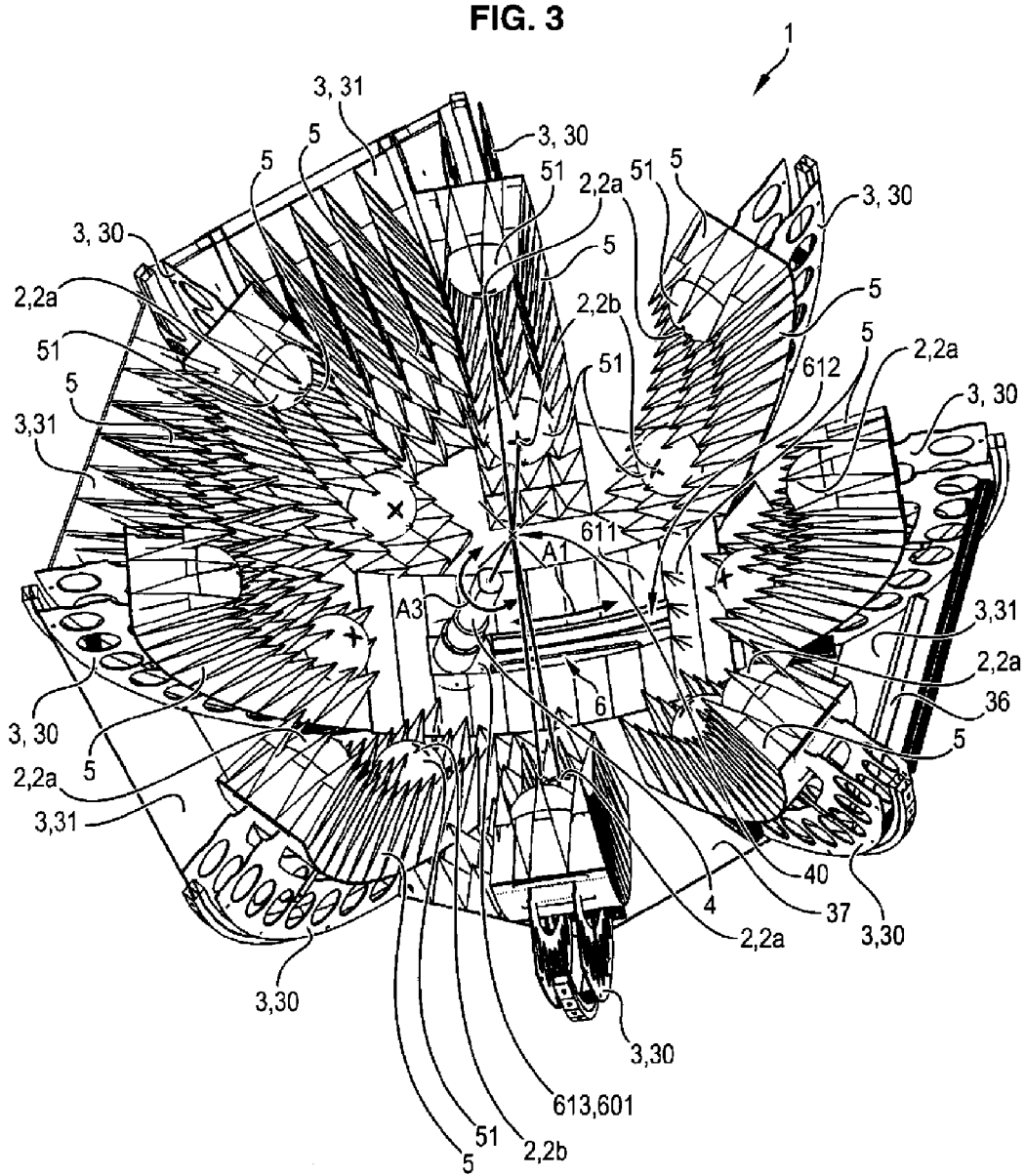
Figure 4:
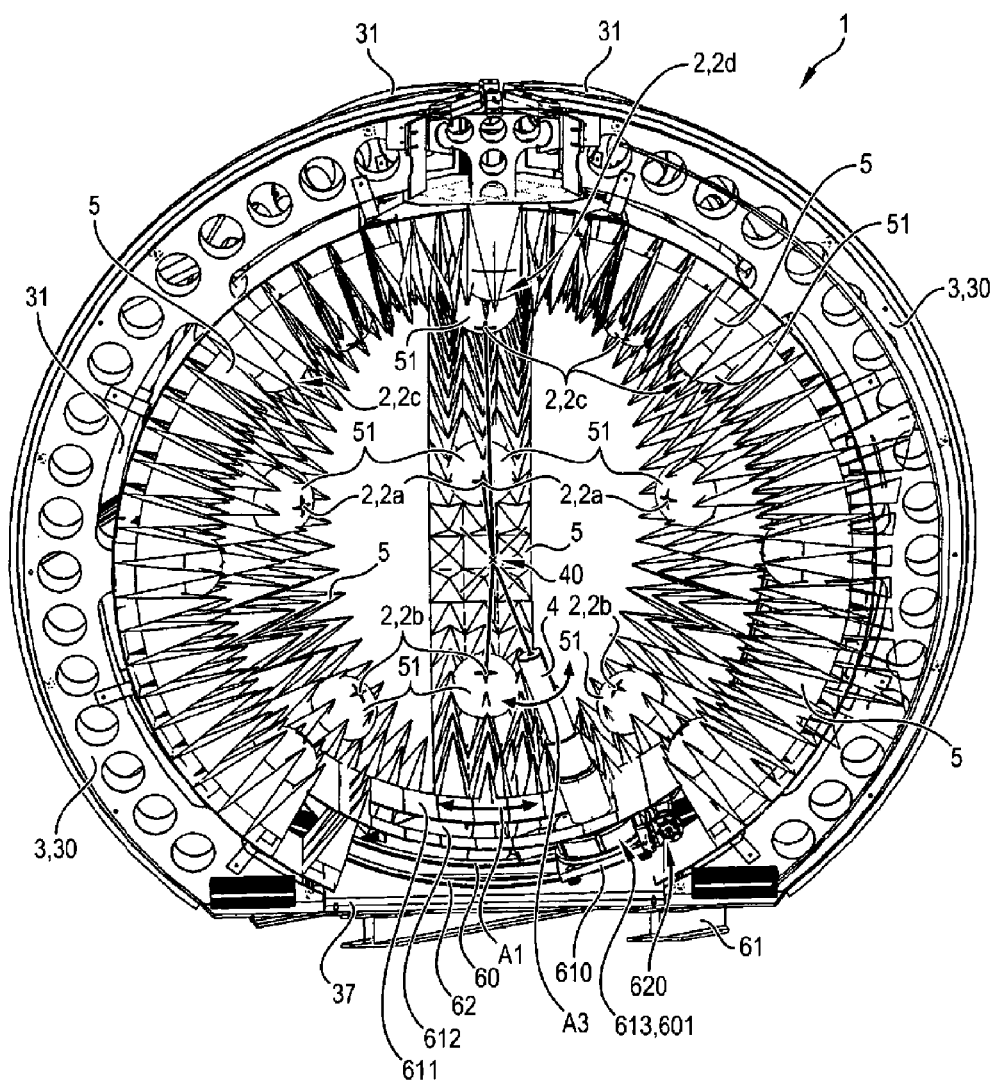
Figure 5:
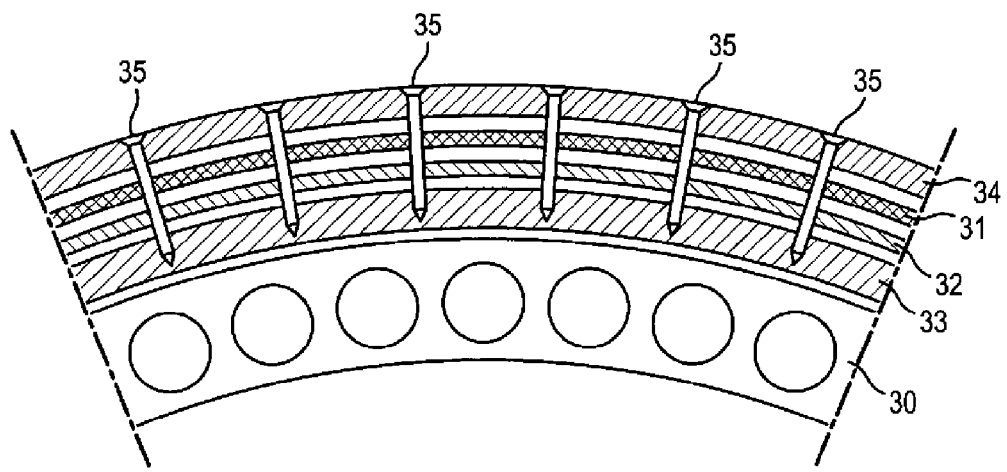
Figure 8:
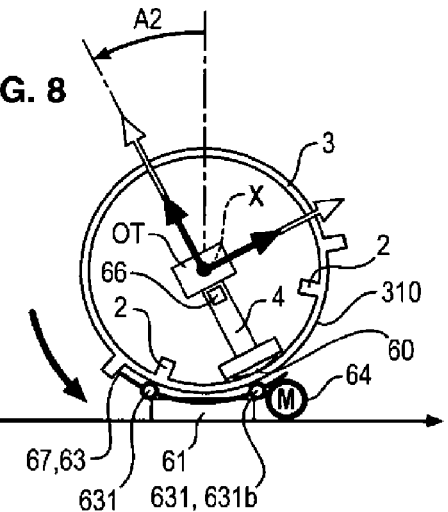
Figure 9:
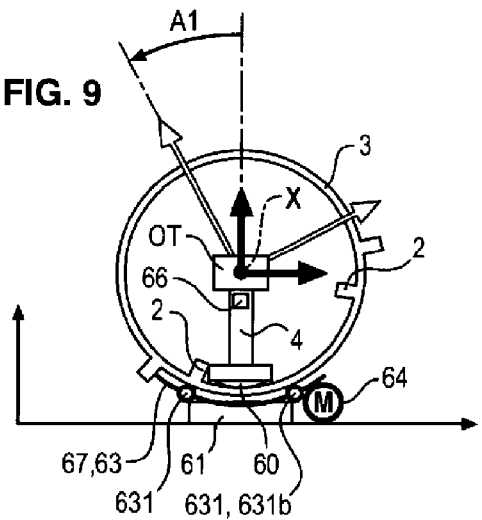
Figure 10:
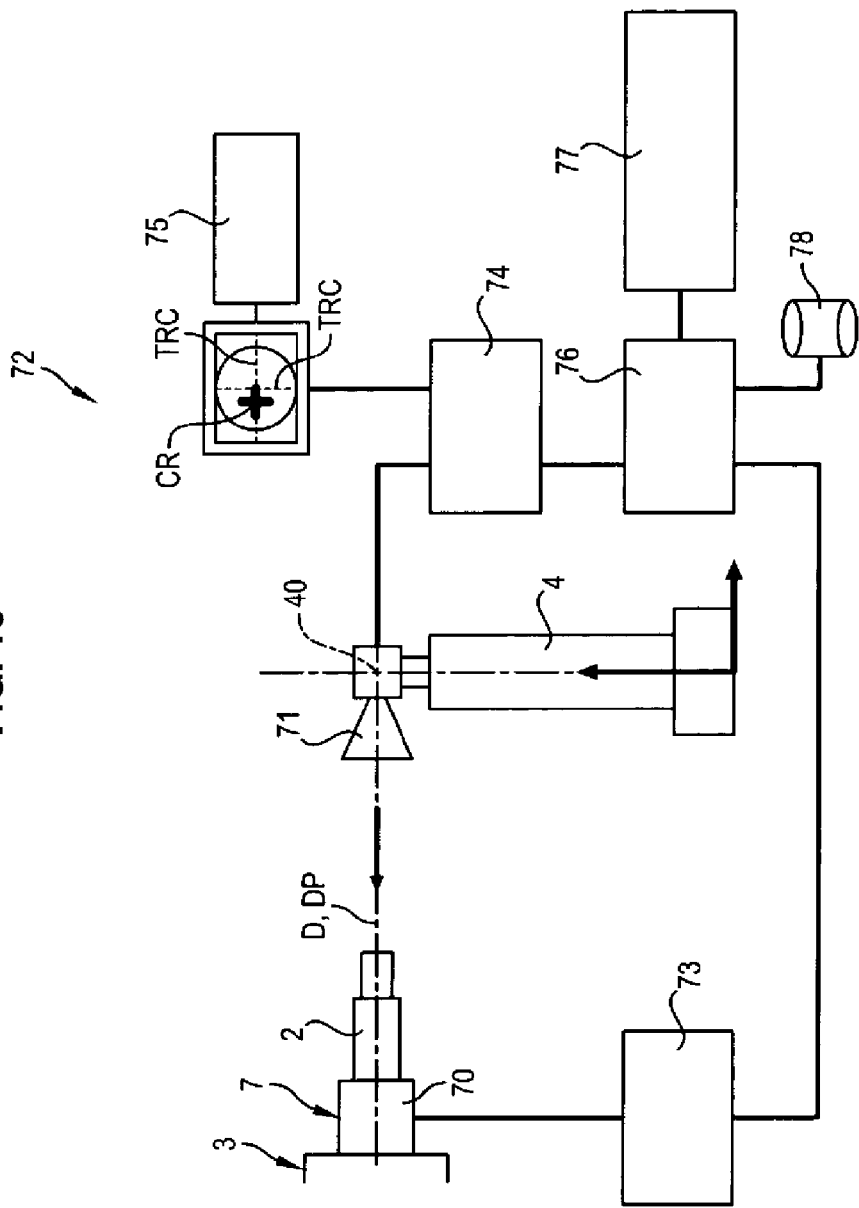
Figure 11:
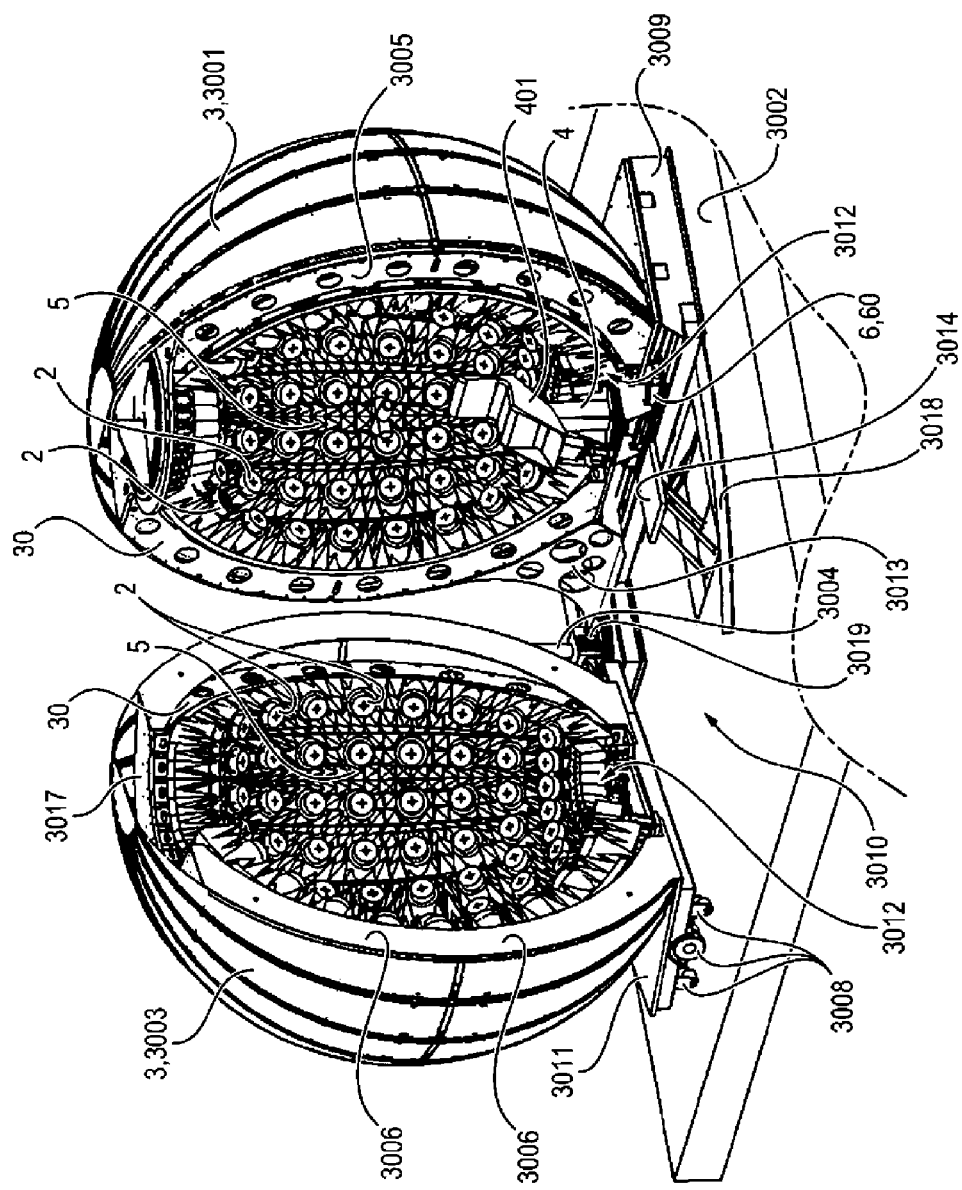
Figure 12:
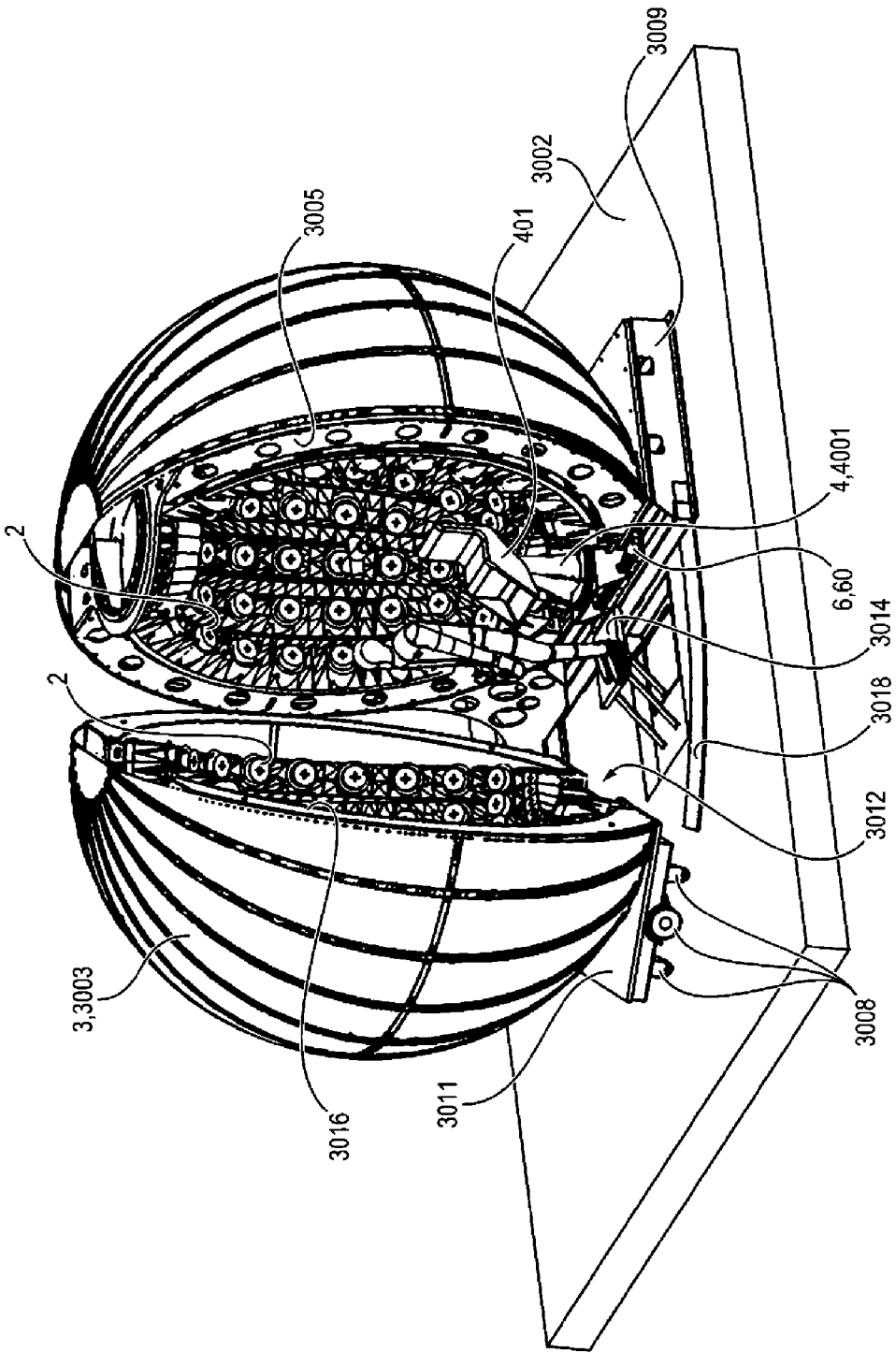
Figure 13:
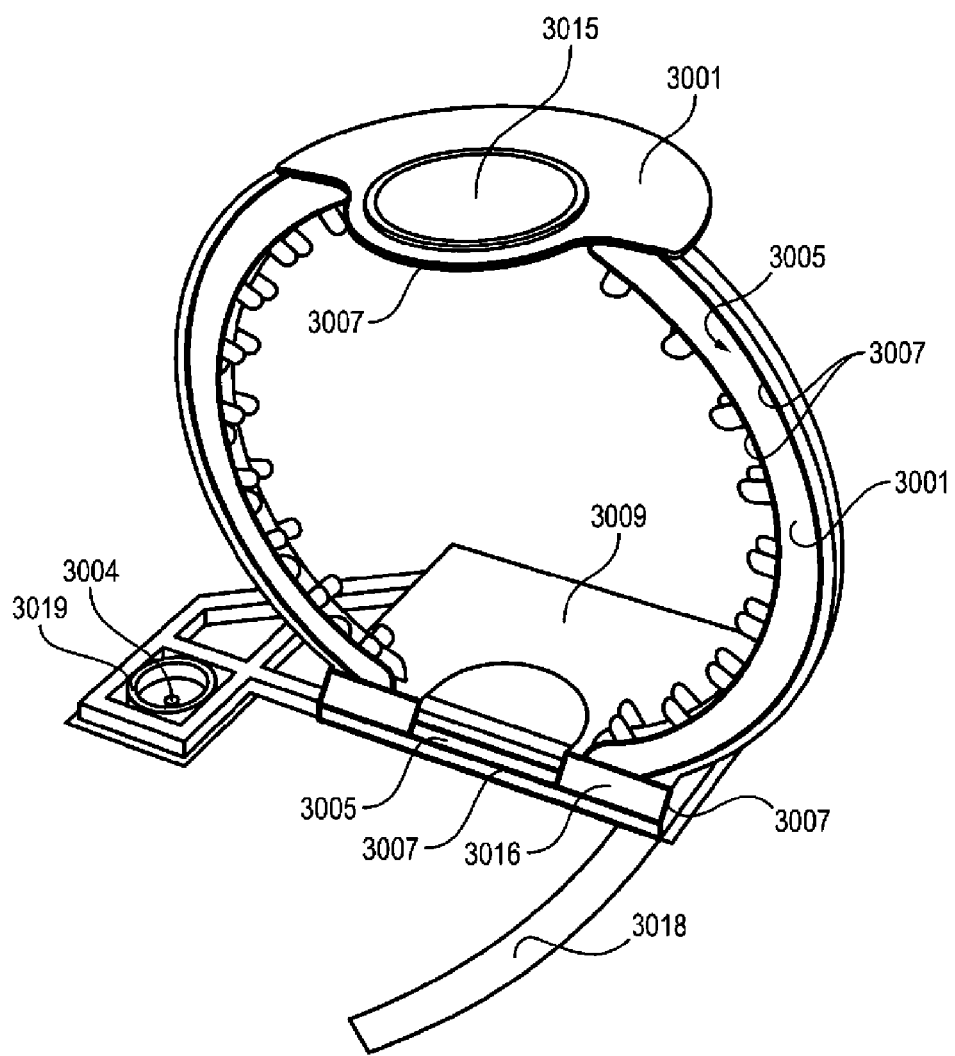

The invention will be more clearly understood from the following description given solely by way of non-limiting example in reference to the diagrams, in which:

FIG. 1 is a schematic side view of an embodiment of the test device according to the invention, FIG. 2 is a schematic plan view in perspective of the interior of the test device according to an embodiment of the invention, FIG. 3 is another schematic plan view in perspective of the interior of the test device according to an embodiment of the invention, also showing the bottom of the support structure for supporting the probes, FIG. 4 is an open frontal schematic view of the test device according to an embodiment of the invention, FIG. 5 is a schematic view in transversal section of part of the device according to an embodiment of the invention, FIGS. 6 to 9 are open frontal schematic views of the test device according to an embodiment of the invention in different sliding positions, FIG. 10 is a block diagram of an alignment device of a probe according to the invention, FIG. 11 is a schematic view in perspective of an embodiment of the invention in an open position, FIG. 12 is a schematic view in perspective of the embodiment of FIG. 11 in a position approaching the closed position, FIG. 13 is a schematic view in perspective of part of the embodiment of FIGS. 11 and 12.

In the embodiment illustrated in FIGS. 1 to 9, the device 1 for electromagnetic testing comprises a network of electromagnetic probes 2 fixed to a support structure 3. For this purpose the support structure 3 comprises support uprights 30 for supporting the probes 2, these uprights 30 being for example in the form of arches extending vertically and being for example conductive.

The device 1 also comprises a support 4 for one or more objects being tested, this support 4 being for example formed by a mast.

The support structure 3 comprises at least one wall 31 extending, according to the three dimensions of the space all around the support 4 for the object being tested, to form a Faraday cage fully closed around the object being tested when the latter is on the support 4. The object being tested is for example a radiating object, as indicated hereinabove. This prevents external electromagnetic radiation from penetrating inside the closed space delimited by the support structure 3. This also prevents the electromagnetic radiations emitted by the probes 2 and/or the electromagnetic radiations emitted by the object being tested arranged on the support 4 from leaving the closed space delimited by the support structure 3. In FIGS. 1 to 4, the device for electromagnetic testing is illustrated with parts of the wall 31 of the support structure removed to show the interior of the latter.

The wall 31 or the walls 31 is or are fixed to the uprights 30 to prevent any electromagnetic leak towards the interior or the exterior, for example by the fastening mode illustrated in FIG. 5, which will be described in more detail hereinbelow.

On its inner side turned towards the object being tested and the support 4, the support structure 3 comprises anechoic electromagnetic absorbers 5 located in the intervals between the probes 2. Consequently, when the uprights 30 as illustrated are inside relative to the wall 31, the uprights 30 are covered by anechoic electromagnetic absorbers 5 turned towards the target point 40 of the probes 2, this target point 40 in general being above or near the support 4 and the object being tested in general having to be centred at this test point 40. The wall 31 is covered on its inner side with anechoic electromagnetic absorbers 5 turned towards the target point 40 at which the object being tested on the support 4 generally must be centred. The electromagnetic absorbers 5 are for example pyramidal, as illustrated. Some of them can for example be flat, especially to cover the base 611 of the system of relative displacement 6. The absorbers 5 prevent the electromagnetic radiations emitted by the probes 2 and/or the electromagnetic radiations emitted by the object being tested from reaching the wall or walls 31 and the uprights 30 or attenuate the latter strongly, to prevent or sharply decrease the reflections which might be caused by the uprights 30 and the wall or the walls 31. In fact, the uprights 30 are for example metallic, especially made of steel or aluminium. The wall or the walls 31 are conductive and made of metal or other conductive material to form an electric wall. They are for example each formed from metal aluminium sheet. The electromagnetic absorbers 5 are arranged over the entire inner surface of the structure 3 with the exception of the probes 2, which are coated in specific electromagnetic absorbers 51 for example of flat form as in FIG. 2, or else shaped as in FIGS. 3 and 4, the absorbers 5 therefore being around and between the probes 2 fitted with their specific absorbers 51.

The walls 31 are curved, for example by being oriented towards the support 4. A plurality of walls 31 is for example provided, with each of the walls 31 fixed between two successive uprights 30. The uprights 30 are, for example, in FIGS. 1 to 4, in the form of semi-circular arches extending along a meridian of a sphere to give the support structure 3 a general spherical form. The wall or the walls 31 forming a Faraday cage can be curved, as illustrated, in the vertical direction only, that is, each formed from a portion of a cylinder having its geometric axis being horizontal. The wall or the walls 31 forming a Faraday cage can also be of general spherical form. Or the wall or the walls 31 forming a Faraday cage can also be facetted.

In addition, a door is provided in one of the walls 31 for allowing a person to enter in the structure 3 to take in and/or remove the object being tested on the support 4. A door of "aircraft" type which opens either upwards in a single piece (car boot type) or downwards (lorry tailgate type), or in two parts (one upwards and the other downwards) can be provided, for example. This door is contoured to follow the curves of the structure 3 so this it presses electromagnetic joints onto the entire periphery of the door. These electromagnetic joints are for example joints of knife type used for faradisation of doors of measuring chambers for antennas.

In the embodiment of FIG. 5, a wall 31 is fixed on the outer side of an upright 30. A radiofrequency joint 32 (also called RF joint) is provided between the upright 30 and the wall 31 to ensure sealing vis-à-vis electromagnetic radiations between the interior and the exterior. Such RF joints 32 are for example formed by a metal ribbon, for example knitted metallic wires. Such a joint 32 is able to adapt to curved or facetted forms.

In addition, a first conductive metal hoop 33 is fixed to the outer side of the upright 30, wherein the RF joint 32 is between the first hoop 33 and the wall 31. A second conductive metal hoop 34 is provided on the outer side of the wall 31 facing the RF joint 32, wherein the wall 31 is therefore now between the second hoop 34 and the RF joint 32. The first hoop 33, the RF joint 32, the wall 31 and the second hoop 34 are fixed to each other by screws 35 passing through them from the exterior. Of course, any other fastening means 35 could be provided. These fastening means 35, by bringing the second hoop 34 closer to the first hoop 33, enable to compress the RF joint 32 to ensure continuity of the electromagnetic shielding, as well as to fix the wall 31 to the upright 30.

As shown in FIGS. 2 and 3, cross members 36 can also be provided between the uprights 30 and behind the absorbers 5 between the latter and the wall 31 to stiffen the support structure. Also, the electromagnetic sealing principle described in the example of FIG. 5 can be used again to connect the walls 31 by means of these cross members 36 from the electromagnetic shielding viewpoint in the event where the walls 31 are constituted by several pieces in the direction of the meridian.

The circular geometry of the uprights 30 in the embodiment illustrated in FIGS. 1 to 5 enables to place the probes 2 uniformly around the support 4 and around its target point 40 in spherical geometry. For example, the angular azimuthal distance between the uprights 30 in the form of circular arches is the same for all the uprights 30. In the same manner, the angular spread between the probes 2, located on the same upright 30, relative to the horizontal axis passing through the target point 40 and perpendicular to the plane of the upright 30 and is for example the same for all the probes 2. Therefore, if the uprights 30 represent the meridians of a sphere, it is for example provided a first set of n probes 2, called 2*a*, located on a same equatorial plane passing through the target point 40, a second set of n probes 2, referenced 2*b*, located in a second plane parallel to the first equatorial plane and arranged at a second negative angle of latitude relative to the first set of probes 2*a*, a third set of n probes 2, called 2*c*, located on a third plane parallel to the first equatorial plane and shifted by a third angle of latitude relative to this equatorial plane, this third angle having the same absolute value as the second angle but being in the opposite direction, as well as another probe 2, 2*d*, located at the apex of the sphere, that is, at the upper point of intersection of the uprights 30, forming the north pole of the sphere. The probes 2 are at an equiangular distance in each of the first, second and third planes indicated hereinabove. The second angle and the third angle are for example equal to 45° in absolute value, with the same for the angles of longitude between the meridians formed by the uprights 30. In the embodiment illustrated in FIG. 2, this angle is for example identical in longitude and in latitude, by being for example equal to 45°. In this particular embodiment the probes are distributed over m meridians and p=m/2−1 planes of latitude, with a probe optionally present at the apex of the structure 3.

In the embodiment illustrated in FIGS. 2 to 4, the support 4 is inside the closed volume defined by the support structure 3.

A relative displacement system 6 for displacing the support structure 3 and the support 4 for the object being tested relative to each other is provided inside the closed volume defined by this support structure 3 and the walls 31.

This displacement system 6 enables to shift the support structure 3 and the support 4 relative to each other according to at least one degree of liberty, and for example according to at least two degrees of liberty, such as for example according to at least one angular displacement about a geometric axis passing through the target point 40, which can include for example an angular displacement A1 in a first non-horizontal and for example vertical plane, passing through the target point 40 and/or another angular displacement in another non-horizontal and for example vertical plane, passing through the target point 40 and secant of the first plane and/or another angular displacement about the vertical geometric axis passing through the target point 40. In the embodiment shown in FIGS. 2 to 4, the system 6 comprises means for making a first relative angular displacement of the support structure 3 relative to the support 4 according to a first sliding angle A1 in a non-horizontal and for example vertical plane (sliding displacement) and for making the other relative angular rotation displacement according to another angle A3 of rotation about the vertical geometric axis passing through the target point 40, which enables to have all the relative possible dispositions of the probes 2 relative to the support 4 and to the target point 40, and then to carry out spatial oversampling by way of the network of probes 2 during measuring of the electromagnetic field. This relative displacement system 6 is as according to document WO 2010/006891, for example.

The relative displacement system 6 located inside the support structure 3 is constituted by at least one first relative angular displacement system 60 allowing at least one determined sliding angular displacement A1 of the support structure 3 and of the support 4 relative to each other about a non-vertical geometric axis. This system 6 comprises the first system 60 for the relative angular displacement of the support structure 3 by the first sliding angle A1. This first angular displacement system 60 comprises for example a guide rail 62 in an arc of a circle fixed to a lower and inner part of the support structure 3, wherein the rail 62 and the pallet 610 supported by this rail 62 are therefore located inside the closed volume defined by the support structure 3, the walls 31 and the lower part. The pallet 610 can be displaced angularly according to the first sliding angle A1 on the rail 62, means 620 being provided to shift the pallet 610 on the rail 62. Another system 601 of relative displacement of the support 4 for the object being tested and of the support structure 3 in rotation relative to each other about a vertical axis is provided, for example because the support 4 is mounted on the pallet 610 by way of the rotation means 613 which allow the support 4 to turn relative to the pallet 610 angularly according to the angle of rotation A3. These rotation means 613 allow the structure 3 to turn relatively about the support 4. FIGS. 3 and 4 show the cover plate 611 of the system 6, which is also covered by absorbers 5 and comprises a passage 612 for displacement of the support 4 in the latter, a lower conductive wall 37 forming a Faraday cage being provided under the displacement system 6. The system 6 for relative displacement of the support structure 3 relative to the support 4 for the object being tested is therefore fully included inside the "integrated Faradisation" of the measuring system, which avoids for example any opening in the lower wall 37 and therefore any rupture of the Faradisation to pass the support 4 through. The system 6 is covered by electromagnetic absorbers 5, 51 by means of the cover plate 611 and therefore allows continuity of the "integrated anechoisation" of the measuring system, which for example avoids any rupture of the covering of absorbents and therefore any parasite reflection and/or diffraction.

In an embodiment of the invention, another second system 63 for relative displacement of the support structure 3 relative to the base 61 is provided, between a lower base 61 intended to be placed on the ground and the support structure 3, inside which is fixed the first system 6 for relative displacement of the support structure 3 relative to the support 4 of the object being tested. This second angular displacement system 63 is similar to the first angular displacement system 60 and is able to move the support structure 3 relative to the base 61 angularly in the same first vertical plane, but by the second sliding angle A2 opposite the first sliding angle A1 (the second angle A2 has the same absolute angle value as the first angle A1 but is of opposite direction to the first angle A1), so that the support 4 remains substantially in a prescribed vertical position to compensate in real time the pivoting of the support 4 and to do away with the effects of gravity on this support 4. The second sliding angle A2 and the first sliding angle A1 are around the same geometric axis X, which is an axis passing through the target point 40 and is for example horizontal.

In the first vertical plane FIGS. 6 to 9 illustrate an embodiment of the second system 63 for relative displacement of the support structure 3 relative to the base 61. This system 63 comprises several support, guide and rolling rollers 631 for the outer surface 310 of the walls 31 of the support structure 3, this outer surface 310 being curved and spherical, for example. One or more 631b of the rollers 631 is driven in rotation by a motor 64 to make roll the outer surface 310 relative to the base 61 by the second angle A2. The rollers 631 are carried by a chassis 67 allowing passage of the outer surface 310 between the rollers 631, this chassis 67 having for example a curved and concave surface towards the surface 310, this chassis 67 being for example a cradle or being called rolling sled and being formed by a portion of a sphere. Of course, several rollers 631 can be provided, directed parallel to the axis about which the angular displacements A1 and A2 are made, but also several other rollers parallel to one or more other directions, to limit the course of the surface 310 on the chassis 67.

An operating example of the systems 6 and 63 is described hereinbelow in a decomposed and fictitious manner in reference to FIGS. 7 and 8, moving from the position of FIG. 6 to the position of FIG. 9

Figure 6:
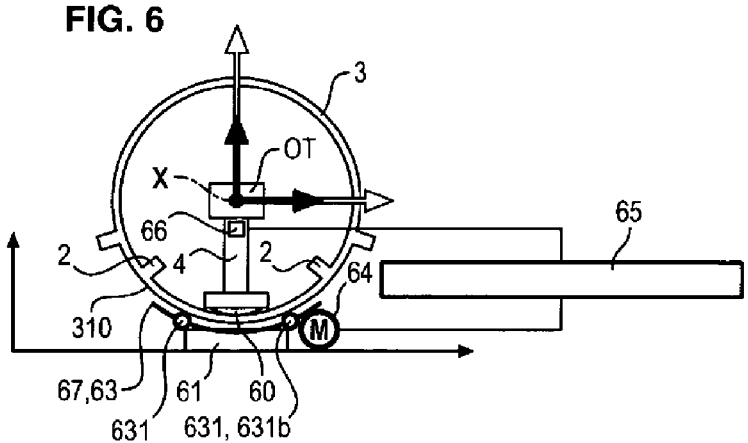
Figure 7:
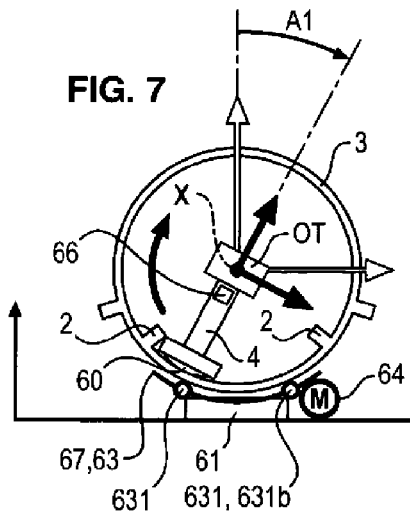

Using a control element the user controls the angular displacement of the first system 60 to shift the support structure 3 for the probes 2 and the support 4 for the object being tested OT relative to each other by the first determined sliding angle A1 around the first geometric axis X, as in FIG. 7. FIG. 7 illustrates the goniometric movement A1 of the support 4 relative to the structure 3, the angles A1 and A2 being initially supposed as zero, as in FIG. 6.

Provided on the support 4 for the object being tested OT is a sensor 66 for measuring the real angle of inclination of the support 4 relative to the vertical. In the position illustrated in FIG. 6, this sensor 66 therefore measures a real zero angle of inclination relative to the vertical. In the fictitious position illustrated in FIG. 7, this sensor 66 therefore measures a real angle of inclination A1 relative to the vertical.

The motor 64 and the sensor 66 are attached to a fedback loop 65 to control the drive motor 64 as a function of the real angle of inclination of the support 4 relative to the vertical, measured instantaneously by the sensor 66.

The loop 65 has a corrector having as setpoint a measured angle of the sensor 66 of zero corresponding to the prescribed position of the support 4. The corrector acts on the command of the motor 64 to correct the real angle measured by the sensor 66 and to make it equal to this setpoint.

In the fictitious position of FIG. 8, by means of the roller 631b driven by the motor 64, this feedback loop 65 turns the surface 310 and the support structure 3 for the probes 2 by an angle A2 equal to the opposite to the real angle A1 of inclination measured by the sensor 66, around the geometric axis X relative to the fixed base 61 and to the fixed chassis 67. FIG. 8 illustrates the reverse rotation A2 of the surface 310 of the support structure 3 for the probes 2 relative to the base 61.

In FIG. 9, the combination of the goniometric movement A1 of FIG. 7 and of the reverse rotation A2 of FIG. 8 moves the support 4 for the object OT back into the prescribed position of FIG. 6 relative to the vertical, prescribed position so-called at the vertical, in which the mast 4 is deemed to be positioned at the vertical.

The goniometric movement A1 of FIG. 7 and the reverse rotation A2 of FIG. 8 are simultaneous and synchronised by the feedback loop 65 in position. The verticality of the mast 4 is ensured permanently. So as soon as the first system 60 goes to angularly move the support 4 around the axis X, the loop 65 causes angular displacement of the support structure 3 for the probes 2 in the reverse direction to keep the support 4 vertical. FIGS. 7 and 8 are fictitious in that goniometric movement and reverse rotation are made by small successive steps which do not incline the support 4 as it is illustrated. Finally, only in FIG. 9 is the support structure 3 of the probes 2 illustrated which has turned by the first angle A1 relative to the support 4, the latter remaining in the same position at the vertical throughout the movement.

In fact, the rocking of the support 4 relative to the vertical would cause flexion of the latter on its height separating the target point 40, where the object being tested must be arranged, and the support structure 3, which would falsify the positioning of the target point 40. In fact, a high level of precision is required on the positioning of the target point 40 relative to the theoretical aiming point of intersection of the probes 2. The target point 40 where the object being tested is arranged must be at this theoretical aiming point of intersection of the probes 2 or be very close to this theoretical aiming point of intersection of the probes 2. For example, for a frequency of 6 GHz of operation of the probes, the target point 40 must be in a theoretical cube of 1.5 mm per side around this theoretical aiming point of intersection of the probes 2. For probes operating at 18 GHz, the target point 40 must be in a theoretical cube of 500 µm per side around this theoretical aiming point of intersection of the probes 2. Consequently, the flexion of the support 4 which is caused by its inclination relative to the vertical risks takings the target point out of these positioning tolerances. Thanks to the two complementary angular positioning systems mentioned hereinabove, specifically the first system 60 for angular positioning of the support 4 located inside the support structure 3 and the second angular positioning system 63 arranged between the support structure 3 and the base 61 fixed to the ground, the support 4 is kept in a prescribed vertical position and it is the support structure 3 which moves angularly relative to the base 61 and to the support 4 of the object being tested. This double system is called antigravitational. This double system enables heavier objects to be placed on the support 4, which therefore do not risk flexing the support 4, or even damaging the support 4, or even falling due to excess inclination and compromising the precision of measurements, or even the feasibility of measurements quite simply. Also, this antigravitational system allows for example having greater angular spacing between probes 2 and therefore reduces the number of probes 2 since the travel of the goniometric movement of the system 6 is no longer limited in amplitude by the constraints of flexion and torsion of the support 4.

According to an embodiment of the invention illustrated in FIG. 10, an system 7 for individual regulating of the mechanical alignment of the probes 2 relative to the target point 40 is provided. This alignment-regulating system 7 comprises for example a motorisation 70 of the probe 2 on its support structure 3 according to at least one degree of liberty other than according to the aiming direction DP of the probe 2 towards the target point 40 and for example according to at least two directions at each probe 2, which are perpendicular or secant relative to the aiming direction DP of the probe 2 towards the target point 40. An automatic alignment device 72 is also provided for example, based for example on an optical camera 71, for example of the CCD type. During an installation phase of the measuring system or even a phase preparatory to taking a measurement of electromagnetic radiations, the optical camera 71 is for example positioned precisely at the test point 40 by being fixed on a reference mast 4 and is oriented successively towards each probe 2 to control proper positioning and proper alignment of the probe 2 by the image taken by the camera 71, the probe 2 forming an identifiable trace CR, for example in the form of a cross, on the image taken by the camera 71. In FIG. 10, the system 7 comprises a block 70 for motorisation of the probe 2 on the support structure 3 according to three dimensions of space to enable to move the probe 2 according to these three dimensions relative to the structure 3, in translation and/or in rotation. A multiaxis controller 73 enables to actuate the motorisation block 70 according to its degrees of liberty. The camera 71 is attached to a module 74 for analysis of the image which it supplies for detecting in this image the trace CR of the probe 2, wherein the image of the camera 71 can also able to be displayed on a control screen 75, for example. The module 74 for image analysis is connected to a management module 76, in turn controlling the multiaxis controller 73 to feedback-control in positions the trace left by the probe 2 in the image of the camera 71 on a predetermined setpoint trace TRC, corresponding to proper alignment of the aiming direction DP on the test point 40, this trace TRC being a software target. The module 76 is therefore programmed to move the probe 2 relative to its support structure 3 by means of the controller 73 and the motorisation block 70 so that the real trace CR of the probe coincides with the setpoint trace TRC. The module 76 is connected to a interface 77 for programmation by the user and to a memory 78 for saving the trails and/or adjustments made for each probe 2. The probe is then held by the motorisation block 70 in the alignment position on the target point 40.

This guarantees that each probe 2 is well aligned on the same target point 40 for later measurements which can be made by the probe 2.

The optical camera can for example also be coupled to a laser aim of the probes.

The probes 2 enable to send or receive an electromagnetic radiation determined in advance towards or from the object being tested placed at the target point 40 to characterise the response from the object to the electromagnetic radiation sent. Of course, it is possible to send different electromagnetic radiations, though determined in advance according to laws calculated by a computer, to simulate three-dimensional electromagnetic environments. So, the device according to the invention enables to generate three-dimensional electromagnetic scenarios representing the real operating conditions of the equipments being tested. In this way, the objects which can be tested at the target point 40 can be so-called "passive" objects being tested comprising one or more antennas fed by cables, or else they can be so-called "active" objects being tested or even "wireless", that is, objects being tested having their own supply battery, their own integrated receiving and/or transmission system and their own communication protocol.

In the embodiment shown in FIGS. 11 to 13, the support structure (3) of the network of probes (2) comprises a first support part (3001) for supporting of a first group of probes (2), fixed on a lower base (3002), and a second support part (3003) for supporting of a second group of probes (2), movable on the lower base (3002) between one and the other of a first closed position against the first part (3001) to form the Faraday cage, and a second distant or open position relative to the first part (3001) to make a free passage space (3010) between the first part (3001) and the second part (3003). Some of the probes 2 (first group) are therefore on the first part 3001, whereas others probes 2 are on the second part 3003. The first part (3001) and the second part (3003) are each formed for example by half of the support structure 3, for example by being substantially hemispherical. The separation and the free space 3010 between the two parts 3001 and 3003 is vertical, for example. The first part (3001) and the second part (3003) comprise respectively at least one first edge (3005) and at least one second edge (3006), which are turned towards each other in the first closed position and which are for example vertical or perpendicular to the lower base 3002, for example plane.

In the embodiment shown in FIGS. 11 to 13, the second part (3003) is articulated about a vertical axis (3004) on the lower base 3002 for displacement in rotation about this vertical axis (3004) between one and the other of the first position and of the second position.

In the embodiment shown in FIGS. 11 to 13, the device comprises at least one motor 3019 to move the second part (3003) relative to the first part (3001) between one and the other of the first position and of the second position, and in the first position capable of keeping the second part (3003) closed against the first part (3001) to form the Faraday cage. The motor 3019 and the axis 3004 are located for example outside the closed space which is delimited by the parts 3001 and 3003 in the first closed position. The motor 3019 is for example located on the axis 3004. The first part 3001 comprises for example under the probes 2 and under the uprights 30 a first lower intermediate plate 3009 fixed to the base 3002. The second part 3003 comprises for example under the probes 2 and under the uprights 30 a second lower intermediate plate 3011, therefore also movable with the part 3003. The plates 3009 and 3011 comprise for example a lower passage opening 3012 for the support 4 of the object being tested. The support 4 can serve for example in the various embodiments of the invention to position a person, for example in a seated position on a seat or a chair 401 fixed on a lower part (mast 4001) of the support 4. The relative displacement system 6, 60 described hereinabove can be provided for example to move the support 4 about a non-vertical axis relative to the structure 3 to create a sliding angle in the first closed position and fixed to the base 3002. The displacement system 601 of the support 4 can also be provided to have an angle of rotation on itself about another axis, described hereinabove. The plate 3011 is connected to the axis 3004 of rotation to turn about the latter. A rear lower arm 3013 is provided between the axis 3004 of rotation and the part 3001 above the plate 3009.

In the embodiment shown in FIGS. 11 to 13, the first edge (3005) and/or the second edge (3006) comprises at least one radiofrequency elastic joint (3007) positioned to be compressed by the other of the first edge (3005) and/or second edge (3006) in the first closed position. This joint or these joints are for example electricitically conductive. For example, the first edge (3005) and the second edge (3006) comprise respectively at least one first radiofrequency elastic joint (3007) and at least one second radiofrequency elastic joint, which are positioned to be compressed by the other of the first edge (3005) and second edge (3006) in the first closed position or to be compressed against each other in the first closed position. Electrical continuity is assured by the joint or the joints between the edges 3005 and 3006 located facing each other in the first closed position to electrically connect one to the other. The radiofrequency elastic joint or the radiofrequency elastic joints are for example formed by a joint made of elastic material, which can be elastomer, for example rubber, wherein electrically conductive braided wires are situated in this elastic material. This joint or these joints are called a metallised radiofrequency elastic joint. The edges 3005 and 3006 are for example plane to exert pressure on the entire joint or joints in the first closed position. In the first closed position, the motor 3019 presses the edge 3006 against the edge 3005 to compress the radiofrequency elastic joint or the radiofrequency elastic joints and ensure electrical continuity between the edges 3005 and 3006. When shifting from the first closed position to the distant second position, the joint or the joints resume their initial non-compressed form. The conductive radiofrequency elastic joint 3007 or the radiofrequency elastic joints 3007 are provided on all the parts opposite the parts 3001 and 3003 in the first closed position, specifically on the edge 3005 and/or 3006, but also on the edge(s) 3016 of the plate 3009 and/or 3011 (edge(s) of the plate 3011 contacting the edge 3016 of the plate 3009 in the first closed position), and on the edge of the upper horizontal crown 3015 of the part 3001 and/or on the upper opening 3017 of the part 3003 of form corresponding to the opening 3017 (edge(s) of the upper horizontal crown 3015 contacting the edge of the upper opening 3017 in the first closed position).

For example, at the bottom the second part 3003 comprises wheels 3008 having contact with the lower base (3002) which comprises for example an upper track (3018) for rolling and guiding for the wheels 3008 towards the part 3001. The wheels are mounted for example under the plate 3011.

This embodiment has the advantage of having two plane surfaces opposite each other for the faradisation which is made by means of metallised elastic joints operating under pressure and which resume their initial form during opening (shift from the first closed position to the second distant position). Conducting the faradisation becomes that much easier. A major advantage also of this embodiment is the fact that the sphere is closed by the pressure of the motor 3019. Distributed along the surfaces 3005 and 3006 opposite are for example small priming springs which are therefore compressed in the first closed position. Then when the power is interrupted, the motor or the motors 3019 automatically release the closing pressure and the small springs trigger the opening action which occurs naturally. This greatly facilitates all the safety procedures when the emergency button is pressed, in the event of a fire, or power interruption: in each case, the power is cut and the sphere opens naturally without external action. In addition, this type of opening enables much larger passage adequate for maintenance activity, for example.

In the second distant position, the free passage space (3010) between the first part (3001) and the second part (3003) for example describes an opening angle of between 20° and 50°, and for example equal to 40°.

The parts 3001 and 3003 are of such a size that they can accommodate an adult, who can test an object held and/or handled by the person located inside the closed space delimited by the structure 3 in the first closed position. The height, the width and the length of the external surfaces of the support structure 3 are for example greater than 3.50 m.

An elevator 3014 for access to the seat 401 or the support 4 can also be provided, where the mast 4 acting to support the object being tested takes the place of the chair 401, as is shown in FIGS. 1 to 10, a reservation being provided in the ground to accommodate the elevator 3014.

A control interface, for example an electric control button is provided for opening (moving from the first closed position to the second distant position) and closing (moving from the second distant position to the first closed position) the parts 3001 and 3003. A button outside the parts 3001 and 3003 is provided for example to control the opening. For example, during opening of the chamber, an audio signal and a blinking light warn those in proximity to stand back so as to avoid any injury to anybody near the system. If a person must be measured, this person must wear a safety harness and the pressure sensors on footrests of the chair 401 must be activated. The elevator 3014 must also be fully retracted so that the system can be closed again. The operator can then close the system. The measurement can then be made in the first closed position. When measuring is complete, the chamber can be reopened, the elevator can rise and the person being tested can exit or the object being tested can be removed.

The invention claimed is:

1. A device for the electromagnetic testing of at least one object, comprising:
    a network of electromagnetic probes for transmission and/or for reception of electromagnetic radiations towards or from the object being tested,
    a support structure for supporting the network of electromagnetic probes, the support structure comprising anechoic electromagnetic absorbers, and
    and a support for supporting the object being tested,
    wherein the support structure for supporting the network of electromagnetic probes comprises at least one conductive wall extending according to the three dimensions of space all around the support for the object being tested, to form a Faraday cage fully closed around the object being tested when the latter is on the support,
    wherein on its inner side turned towards the object being tested and the support, the anechoic electromagnetic absorbers are located in intervals between the electromagnetic probes,
    wherein the support structure comprises at least one upright to which the electromagnetic probes and the at least one conductive wall are fixed, wherein the anechoic electromagnetic absorbers are also provided on an inner side of the at least one upright in the intervals between the electromagnetic probes,
    wherein a closed volume delimited by the support structure contains a relative displacement system for relative displacement of the support relative to the support structure according to at least one degree of liberty,
    wherein the relative displacement system located inside the support structure is constituted by at least one first relative angular displacement system enabling at least one first determined sliding angular displacement of the support structure relatively to the support about a non-vertical geometric axis,
    wherein the support structure rests on a lower base,
    wherein provided between the lower base and the support structure is another angular displacement system enabling to displace the support structure relative to the lower base by a second angle, which is in a same vertical plane as the first determined sliding angular displacement, which is of the same absolute value as the first determined sliding angular displacement and which is opposite to the first determined sliding angular displacement of the first relative angular displacement system of the support relative to the support structure, so that the support for the object being tested retains a prescribed and substantially constant position relative to a vertical axis.

2. The device according to claim 1, wherein the conductive wall is curved or is facetted.

3. The device according to claim 1, wherein the support structure has a general spherical shape.

4. The device according to claim 1, wherein the at least one conductive wall is fixed to an outer side of the at least one upright by means of at least one radiofrequency joint.

5. The device according to claim 1, wherein the support structure delimits the closed volume containing the support for the object being tested.

6. The device according to claim 1, wherein the support structure of the network of electromagnetic probes comprises a first part for supporting a first group of electromagnetic probes, fixed on a lower base, and a second part for supporting a second electromagnetic group of probes, movable on the lower base between one and the other of a first closed position against the first part to form the Faraday cage, and a second position removed relative to the first part to make a free passage space between the first part and the second part.

7. The device according to claim 6, wherein the second part is articulated about a vertical axis on the lower base for displacement in rotation about this vertical axis between one and the other of the first closed position and of the second position.

8. The device according to claim 6, further comprising at least one motor to move the second part relative to the first part between one and the other of the first closed position and of the second position, and in the first position capable of keeping the second part closed against the first part to form the Faraday cage.

9. The device according to claim 6, wherein the first part and the second part comprise respectively at least one first edge and at least one second edge, which are turned towards each other in the first closed position, the first edge and/or the second edge comprising at least one radiofrequency elastic joint positioned to be compressed by the other of the first edge and/or second edge in the first closed position.

10. The device according to claim 1, wherein the second other angular displacement system comprises a plurality of support rollers for supporting an outer curved surface of the wall of the support structure on the base and at least one drive motor for driving at least one of the rollers to make said outer curved surface of the wall of the support structure roll relative to the base by said second angle.

11. The device according to claim 10, further comprising:
a control element for controlling the sliding angular displacement of the first angular displacement system,
at least one sensor for measuring a real angle of the support for the object being tested relative to the vertical,
a feedback loop for controlling the drive motor as a function of the angle measured by the sensor, so that the angle measured by the sensor is equal to a constant value corresponding to said prescribed position of the support relative to the vertical.

12. The device according to claim 1, wherein the electromagnetic probes are distributed equiangularly according to at least one spherical coordinate about a same target point of the electromagnetic probes.

13. The device according to claim 1, further comprising on at least one of the electromagnetic probes an individual regulating system for regulating the mechanical alignment of the electromagnetic probe relative to a target point, which is the same for all the electromagnetic probes and where the object being tested must be centred on the support.

14. The device according to the claim 13, wherein the individual regulating system for regulating the mechanical alignment of the electromagnetic probe is associated to at least one optical detection camera positioned at the target point to measure the mechanical alignment of the electromagnetic probe.

15. The device according to claim 13, wherein the individual regulating system for regulating the mechanical alignment of the electromagnetic probe comprises motorisation of said electromagnetic probe on the support structure to move the electromagnetic probe relative to the support structure according to at least one degree of liberty other than in an aiming direction of the electromagnetic probe towards the target point.

16. The device according to claim 15, further comprising an analysis module for analysing the image supplied by the camera to detect in this image the trace of said electromagnetic probe and a feedback module for controlling the motorisation to align the detected trace of the electromagnetic probe on a setpoint trace corresponding to the alignment of the electromagnetic probe on the target point.

* * * * *